(12) United States Patent
Lee et al.

(10) Patent No.: US 8,211,748 B2
(45) Date of Patent: Jul. 3, 2012

(54) SYSTEMS AND METHODS FOR LOW PROFILE DIE PACKAGE

(75) Inventors: Hun K. Lee, Penang (MY); Sai M. Lee, Penang (MY); Li C. Tai, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1162 days.

(21) Appl. No.: 11/511,175

(22) Filed: Aug. 28, 2006

(65) Prior Publication Data

US 2008/0048302 A1 Feb. 28, 2008

(51) Int. Cl.
*H01L 21/00* (2006.01)
(52) U.S. Cl. ........ 438/112; 438/106; 438/107; 438/111; 438/118; 438/124; 257/731; 257/783; 257/784; 257/787
(58) Field of Classification Search .................. 438/106, 438/107, 111, 118, 123, 124, 127, 112, 125, 438/126, FOR. 367, FOR. 380; 257/678, 680, 731, 782, 783, 784, 787
See application file for complete search history.

(56) References Cited

U.S. PATENT DOCUMENTS

| 7,126,228 | B2 * | 10/2006 | Hamren et al. | 257/783 |
| 2005/0042782 | A1 * | 2/2005 | Hamren et al. | 438/17 |
| 2005/0184367 | A1 * | 8/2005 | Bowen | 257/666 |

* cited by examiner

*Primary Examiner* — N Drew Richards
*Assistant Examiner* — Joannie A Garcia

(57) ABSTRACT

A semiconductor integrated circuit (IC) device is defined by a low-profile package without a die attach pad (DAP). In place of the DAP, an adhesive element is used to retain a die relative to a lead frame during processing. In one example, a method of manufacturing the device includes sealing the lead frame on one side using an adhesive tape and exposing a portion of the tape within a die attach region. The die is secured onto the tape adhesive and held in place during subsequent processing, such as a wire bonding procedure to couple the die to external portions of the frame.

16 Claims, 5 Drawing Sheets

US 8,211,748 B2

SYSTEMS AND METHODS FOR LOW PROFILE DIE PACKAGE

TECHNICAL FIELD

The invention relates to semiconductor chip packages and more particularly to systems and methods for lowering the profile of semiconductor devices using lead frames.

BACKGROUND OF THE INVENTION

Leadframes are used to provide a stable support structure for positioning a semiconductor die during semiconductor manufacturing. Typical leadframes include a centrally located die attach pad (DAP) surrounded by a plurality of conductive lead segments used to attach various electrical conductors in close proximity to the die. The remaining gaps between the lead segments and conductor pads on the die surface are typically bridged by thin metallic wires. In application, the other ends of the lead segments can be electrically connected to other structures, for example, a printed circuit board.

Limitations of typical lead frame-based IC manufacturing technologies include delamination defects, relatively large product size, relatively large product thickness (high profile) and limited thermal and electrical conductivity of the product. Typical lead frame design presents size constraints which limit the opportunity to reduce overall device volume. Delamination defects are often associated with the epoxy/device interface at the DAP. Additionally, electrical conductivity may be impaired as the layers of epoxy and DAP each have associated impedances. The combined impedance of the epoxy and DAP often degrades overall device performance.

BRIEF SUMMARY OF THE INVENTION

The present invention is directed to systems and methods for manufacturing a semiconductor integrated circuit (IC) device without use of a die attach pad (DAP). In place of a DAP, an adhesive element is used to temporarily secure a die within a lead frame opening during processing. In one embodiment, a method includes applying an adhesive tape to one side of a lead frame. At the opposite side, adhesive is exposed within an opening of the lead frame. The opening and exposed adhesive define a region used to secure a die. The die is placed on the adhesive surface within the die attach region and is held by the adhesive tape during subsequent processing, including for example, a wire bonding procedure which couples the die to external portions of the frame. Wire bonding, such as bond stitch on ball (BSOB), may be used to connect the die to external portions of the frame prior to an encapsulation process. Chip packages can be separated from the lead frame via a singulation process including, for example, punch or saw procedures.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 8:
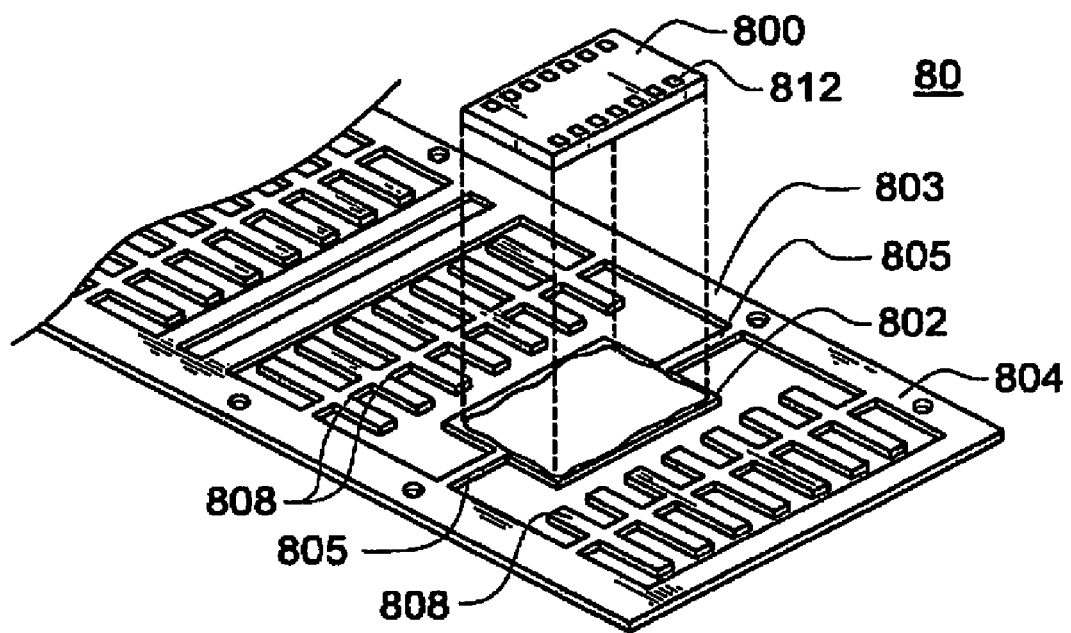
FIG. 8 is a perspective exploded view of components of a prior art package.

Prior to a detailed description of the inventive concepts, it might be helpful to review prior art technology with respect to FIG. 8. Assembly 80 in FIG. 8 depicts bonding of die 800 to die attach pad 802 of lead frame 804 during a manufacturing process. Die attach pad 802 is secured relative to side rails 803 of lead frame 804 via a pair of arms 805. Once die 800 is bonded thereto, die attach pad 802 provides a relatively stable base for die 800 during a subsequent wiring process. Die 800 is electrically connected to a plurality of leads 808 through bonding wires which connect bonding pads 812 on an upper surface of die 800 to respective corresponding leads 808. Die 800, die attach pad 802 and bonding wires 810 are encapsulated to provide a package body.

Figure 1:
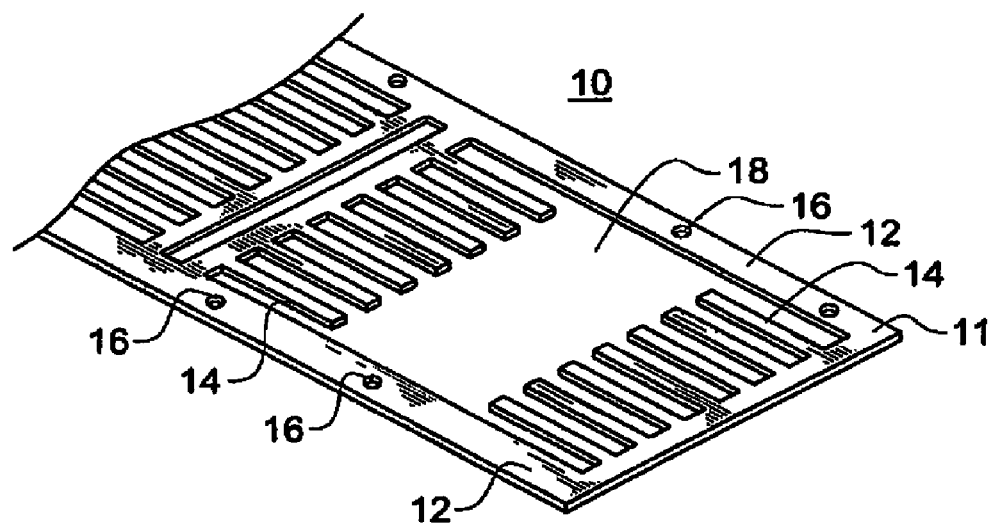
FIG. 1 shows a perspective view of one embodiment of a lead frame semiconductor device.

FIG. 1 shows a perspective view of one embodiment 10 of a semiconductor device having frame 11 suitable for employment with a method according to an embodiment of the invention. In the embodiment shown, frame 11 is a lead frame and has a pair of opposing side rails 12 and a pair of rows of leads 14. Frame 11 may be a half-etched frame. Side rails 12 are disposed so that one is opposed to the other, and, in one example, have plural through-holes 16 formed at regular intervals. Side rails 12, in this embodiment, are in mechanical contact with rails (not shown) having a plurality of projections when transferring lead frame 11 within a semiconductor chip packaging line. The rail projections engage through-holes 16 of side rail 12. Thus, when the rail moves, lead frame 11 is transferred accordingly.

Frame 11 does not have a die attach pad (DAP) located between side rail 12 and leads 14, unlike conventional lead frames as shown in FIG. 8. In place of a DAP, die attach region 18 is defined generally as the region between side rails 12 and leads 14 into which a die will be subsequently placed. In one embodiment, die attach region 18 is defined within a lead frame aperture.

Figure 2:
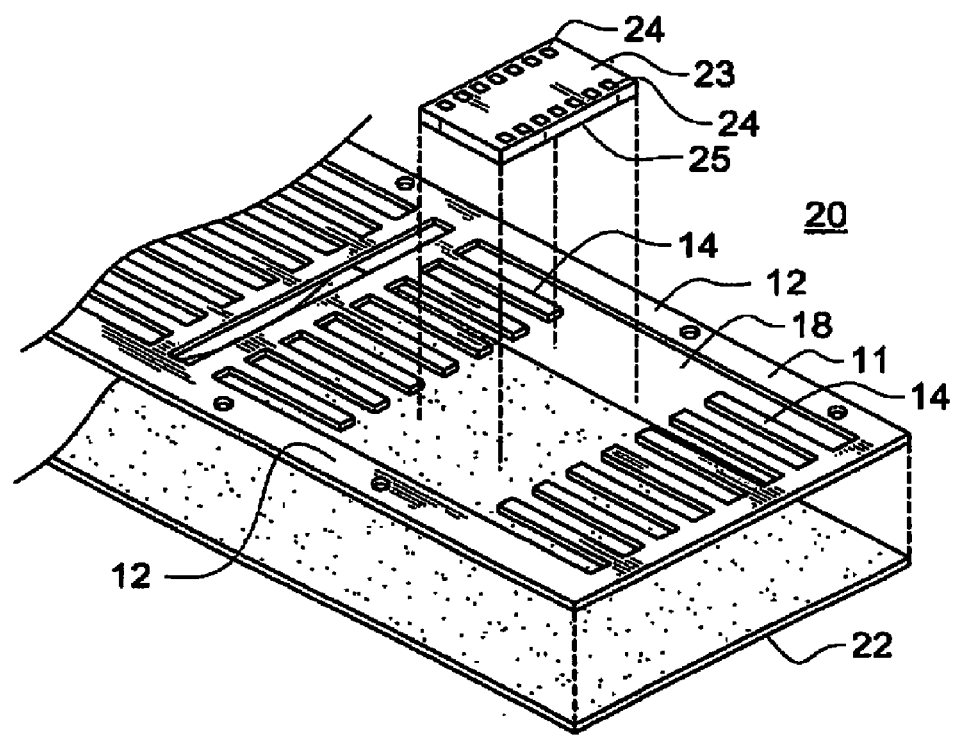
FIGS. 2 through 5 show perspective views of a lead frame assembly using the lead frame of FIG. 1.

FIG. 2 is an exploded perspective view showing assembly 20 including tape 22 applied to an under surface of lead frame 11. In the illustrated embodiment, tape 22 extends between the side rails 12 and adheres across the surface of lead frame 11. Tape 22 in alternative embodiments may be larger or smaller in width as compared to the width of lead frame 11. Tape 22 may be applied using any of a variety of assembly processes. In this example, tape 22 is a high temperature polyimide adhesive tape. However, other inventive methods may employ one or more other kinds of tape.

Assembly 20 depicts silicon die 23 being brought into contact with adhesive tape 22 within die attach region 18 of frame 11. Silicon die 23 includes a plurality of bonding pads or terminals 24 on a top surface and a plurality of contact pads or terminals 25 on an opposite lower surface. Tape 22 maintains die 23 within die attach region 18 during a subsequent wiring process. Note that die 23 can be attached to adhesive tape 22 before tape 22 is positioned on frame 11.

Figure 3:
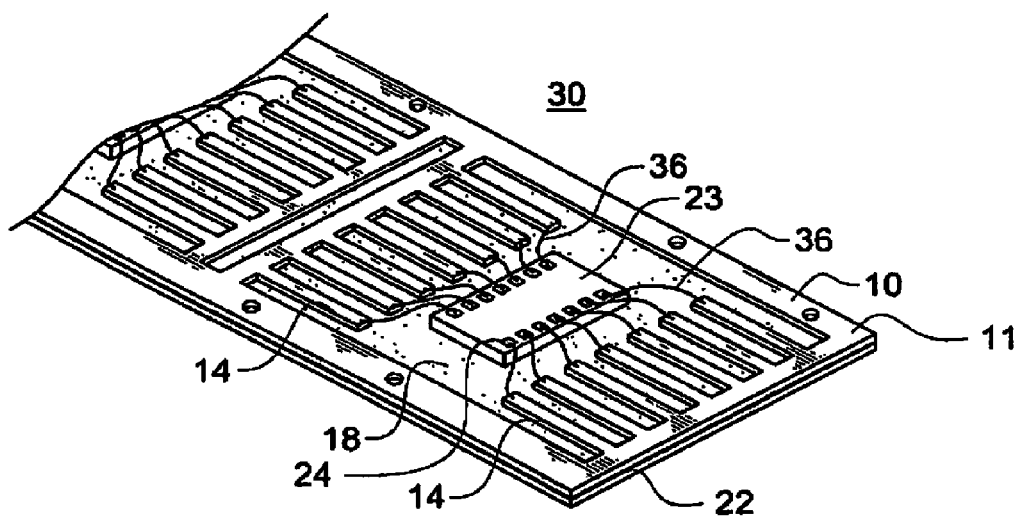

FIG. 3 shows assembly 30 subsequent to a wire bonding process wherein individual wires 36 are connected between the row of leads 14 and bonding pads 34 so as to electrically and mechanically connect die 23 to device 10. A variety of different wire bonding techniques may be utilized to perform this step. Advanced bonding techniques, such as bond stitch on ball (BSOB), may be utilized to provide low profile loop heights.

Figure 4:
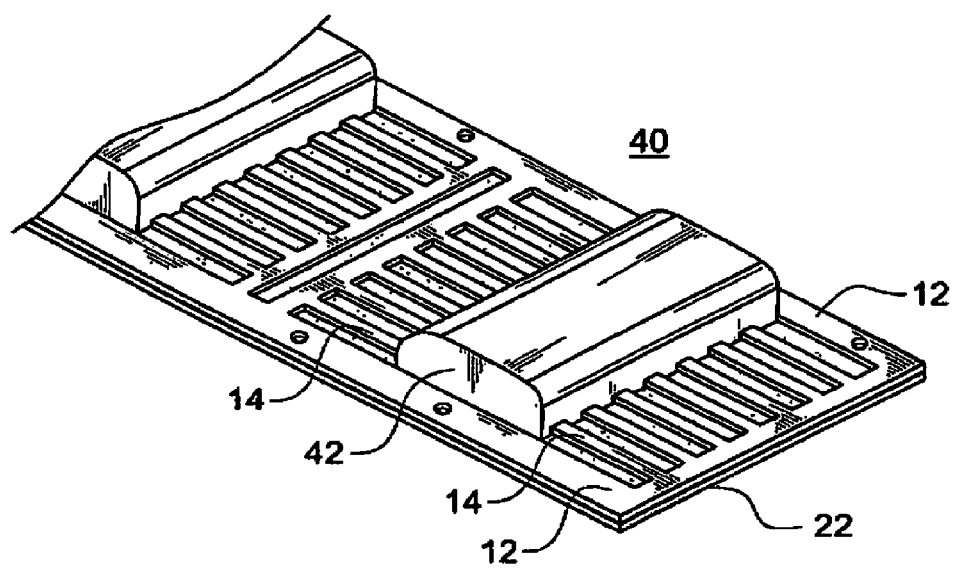

FIG. 4 shows assembly 40 subsequent to an encapsulation process. The encapsulation process includes, for example, resin compound 42 placed so as to cover the die 23, wires 36 and inner portions of leads 14. A liquid resin compound, such as a polyimide compound, can be used. After the encapsulation process, tape 22 is removed, either partially or fully, to expose lower contact terminals 25 of die 23. At this point individual packages can be defined through a separation process utilizing, for example, sawing, forming or punching techniques. Tape 22 can be removed from die 23 prior to or subsequent to the separation process.

Figure 5:
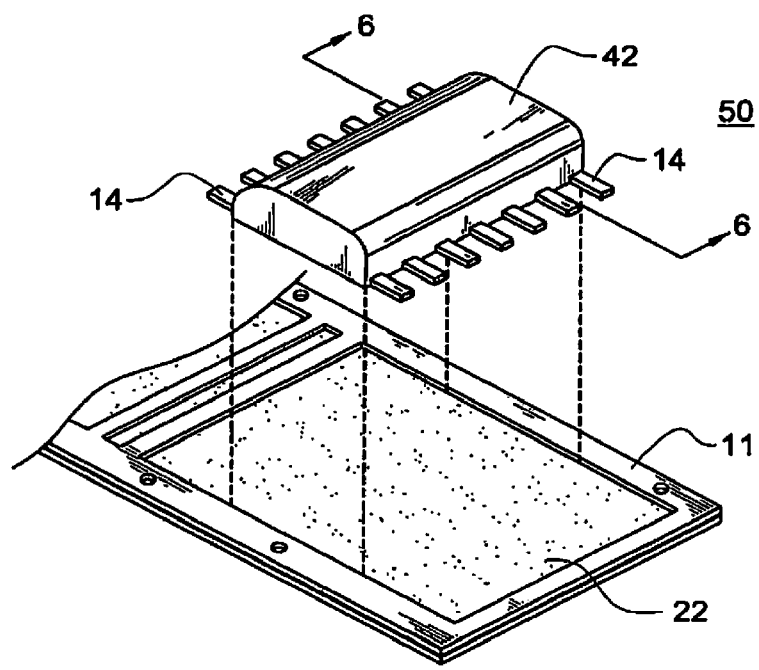

FIG. 5 shows assembly 50 and depicts a separation process wherein encapsulant 42 containing die 23 is separated from lead frame 11. Typical punch or sawing processes may be utilized.

Figure 6:
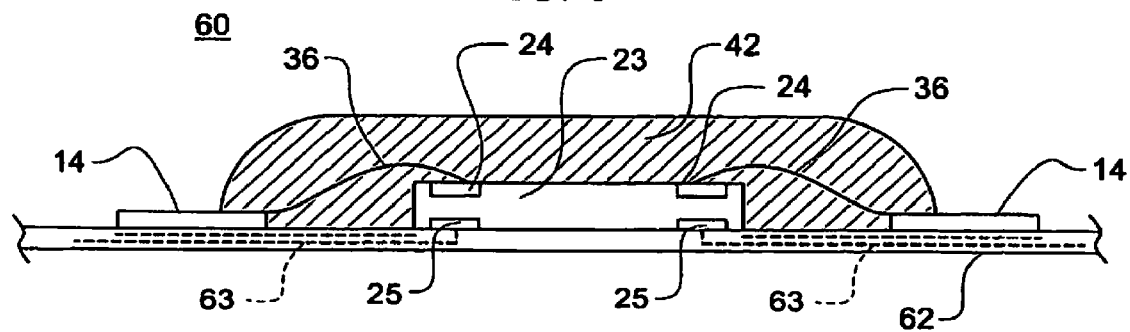
FIG. 6 shows a cross-sectional view of a lead frame assembly of FIG. 5 taken along lines 6-6.

FIG. 6 shows a cross-sectional view of die 23 within encapsulant 42 forming part of device 60. Device 60 includes printed circuit board 62. Contact pads 25 of die 23 are directly connected to traces 63 of printed circuit board 62. Pads 14 are also connected to traces 63 of printed circuit board 62 or to other devices.

Figure 7:
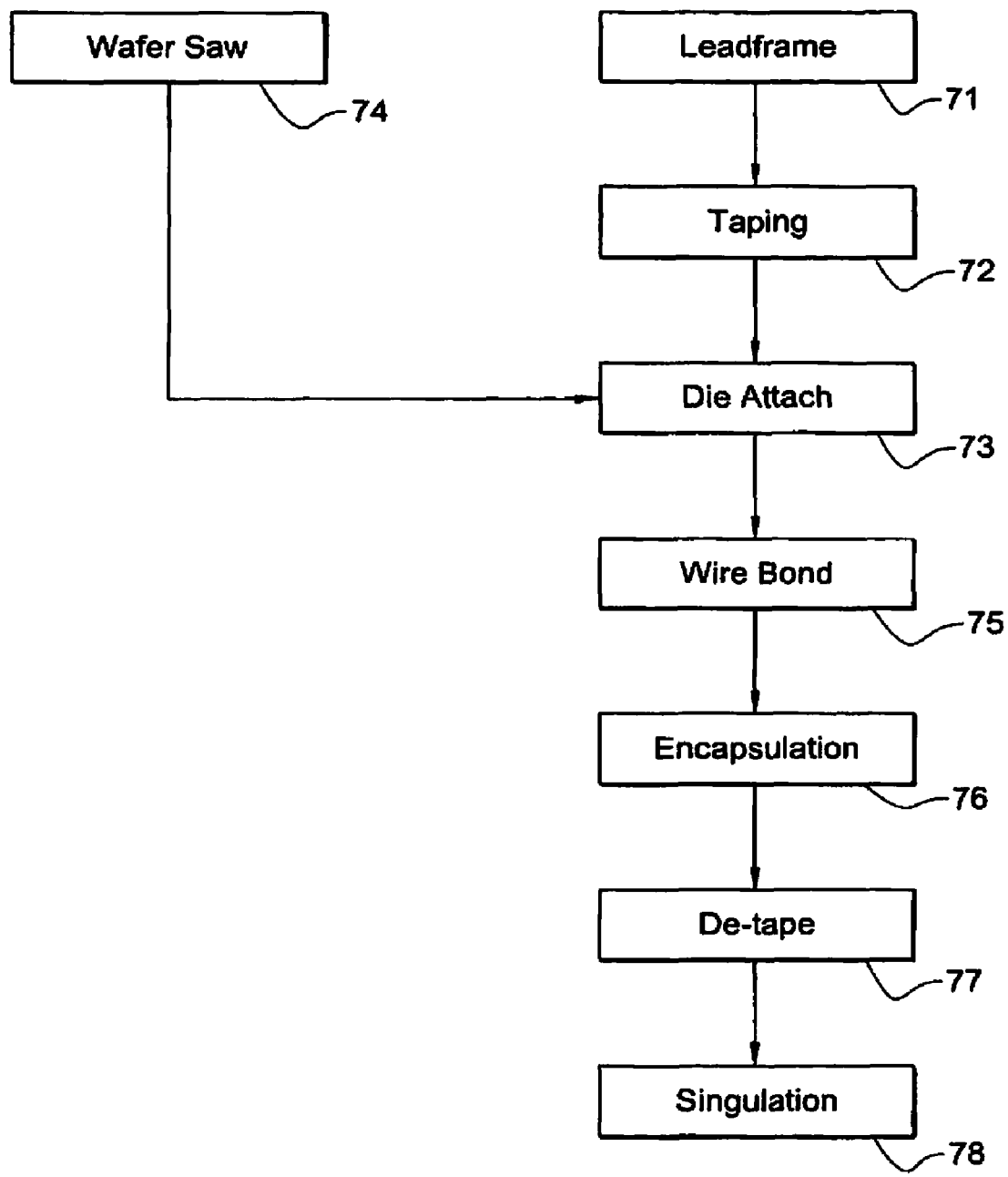
FIG. 7 shows a flow chart of a manufacturing process using the lead frame of FIG. 1.

FIG. 7 shows process flow chart 70 in accordance with an embodiment of the invention. In an initial step 71, lead frame 11 is provided, for example, in roll form. At step 72, adhesive tape 22 is brought into contact with a surface of lead frame 11 covering the openings and providing an adhesive surface at an opposite side of lead frame 11 within die attach region 18. At step 73, die 23 is brought into contact with the adhesive surface of tape 22 within die attach region 18. Die 23 was previously processed through, for example, wafer sawing process 74. At step 75, tape 22 adhesively retains die 23 within region 18 during a wiring process. The wiring process connects bonding pads 24 of die 23 to leads 14 of frame 11. At step 76, die 23 and portions of lead frame 11 are encapsulated using an encapsulation processes. Subsequent to encapsulation, tape 22 is removed at step 77 to exposed contacts 25. At step 78, a singulation process separates encapsulated dies 23 from lead frame 11. Further processing can be employed to yield a discrete package suitable for applications, such as direct connection to a printed circuit board.

Chip fabrication processes according to various embodiments of the present invention eliminate lamination defects of epoxy/die attach pad interface. A reduction of overall device size can be attained. For example, overall profiles of 4-5 mm may be achieved. Additionally, chip performance can be increased through an impedance reduction achieved by elimination of a DAP and direct solder contact of the lower die pads 25 to corresponding pads on a printed circuit board. Note, during fabrication, pads 25 can be covered to prevent contamination from the adhesive of tape 22. For purposes of this application, such pads will be considered in contact with the adhesive of tape 22.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor package having no die attach pad disposed therein, comprising:
   applying an adhesive element to a support frame having no die attach pad forming a portion thereof, the support frame comprising side rails and leads, an aperture being disposed through the support frame to form a die attach region, the aperture having a perimeter defined at least partially by the side rails and leads, said adhesive element being attached to at least portions of the side rails and the leads and having an adhesive surface thereof exposed within the die attach region of the support frame;
   securing for further fabrication a semiconductor die comprising terminals to said adhesive surface of said exposed adhesive element within said die attach region;
   electrically connecting leads of said frame to said die while the die is being held within the aperture by the adhesive element;
   encapsulating said die and leads such that at least one terminal of said die is uncovered by said encapsulant.

2. The method of claim 1, wherein said securing comprises:
   placing said die in contact with said adhesive surface of said adhesive element, and
   removing said adhesive element from said frame so as to expose at least one electrical terminal on a side of said die in contact with said adhesive element.

3. The method of claim 2, wherein said adhesive element is a tape.

4. The method of claim 3, further comprising:
   removing said adhesive tape prior separating said frame from said die.

5. The method of claim 1, wherein said frame is a lead frame.

6. The method of claim 1, wherein at least one set of electrical contacts is disposed along at least a portion of said perimeter.

7. A semiconductor package having no die attach pad disposed therein or forming a portion thereof, comprising:

a semiconductor die comprising terminals disposed on upper and lower surfaces thereof and having a first outer die perimeter;

a support frame having no die attach pad forming a portion thereof, the support frame comprising a plurality of side rails, leads connected to and projecting from at least two of the side rails, and an aperture disposed through the support frame to define a die attach region, the aperture having a second perimeter defined by the side rails and the leads, the leads extending inwardly from the side rails to which they are connected towards the second perimeter;

wherein the die is disposed within the die attach region, the first perimeter is smaller than the second perimeter and does not overlap with any portions of the second perimeter when the die is disposed within the die attach region, at least some of the leads are electrically connected to corresponding terminals by wires, an encapsulant covers at least a portion of the die and the leads, and at least one terminal disposed on the underside of the die is not covered by the encapsulant.

8. The semiconductor package of claim 7, further comprising:

a printed circuit board electrically connected to the terminal not covered by the encapsulant.

9. The semiconductor package of claim 7, wherein the wires are connected to the leads and the terminals by wire bonding.

10. The semiconductor package of claim 7, wherein the wires are connected to the leads and the terminals by bond stitch on ball (BSOB) bonding.

11. The semiconductor package of claim 7, wherein the encapsulant comprises a resin compound.

12. The semiconductor package of claim 11, wherein the resin compound is a polyimide compound.

13. The semiconductor package of claim 11, wherein the package has a profile between 4 mm and 5 mm.

14. The semiconductor package of claim 11, wherein the at least two side rails to which the leads are connected and from which the leads project oppose one another.

15. The semiconductor package of claim 14, further comprising third and fourth opposing rails having no leads projecting therefrom.

16. The semiconductor package of claim 14, wherein the third and fourth rails are disposed at right angles with respect to the opposing first and second rails.

* * * * *